United States Patent
Hu et al.

(10) Patent No.: US 7,916,513 B2
(45) Date of Patent: Mar. 29, 2011

(54) NON-DESTRUCTIVE READ BACK FOR FERROELECTRIC DATA STORAGE DEVICE

(75) Inventors: Shan Hu, Pittsburgh, PA (US); Tong Zhao, Cranberry Township, PA (US); Florin Zavaliche, Cranberry Township, PA (US); Joachim Ahner, Pittsburgh, PA (US); Stephen John Wrazien, Cranberry Township, PA (US); Martin Gerard Forrester, Murrysville, PA (US)

(73) Assignee: Seagate Technology LLC, Scotts Valley, CA (US)

( * ) Notice: Subject to any disclaimer, the term of this patent is extended or adjusted under 35 U.S.C. 154(b) by 293 days.

(21) Appl. No.: 12/265,418

(22) Filed: Nov. 5, 2008

(65) Prior Publication Data

US 2010/0110754 A1    May 6, 2010

(51) Int. Cl.
*G11C 11/22* (2006.01)
*G11C 11/24* (2006.01)

(52) U.S. Cl. ........................ 365/145; 365/149

(58) Field of Classification Search .................. 365/145, 365/149
See application file for complete search history.

(56) References Cited

U.S. PATENT DOCUMENTS

| | | | | |
|---|---|---|---|---|
| 5,119,154 A * | 6/1992 | Gnadinger | ........... | 365/145 |
| 5,514,484 A * | 5/1996 | Nashimoto | ........... | 365/145 |
| 5,519,234 A * | 5/1996 | Paz de Araujo et al. | ........... | 365/145 |
| 5,623,439 A * | 4/1997 | Gotoh et al. | ........... | 365/145 |
| 5,751,625 A * | 5/1998 | Mihara | ........... | 365/145 |
| 5,777,977 A | 7/1998 | Fujiwara et al. | | |
| 6,151,241 A * | 11/2000 | Hayashi et al. | ........... | 365/145 |
| 6,232,167 B1 * | 5/2001 | Satoh et al. | ........... | 365/145 |
| 6,337,805 B1 * | 1/2002 | Forbes et al. | ........... | 365/145 |
| 6,420,192 B2 | 7/2002 | Miki et al. | | |
| 6,438,019 B2 | 8/2002 | Hartner et al. | | |
| 6,507,509 B1 * | 1/2003 | Ohtsuka et al. | ........... | 365/145 |
| 6,515,957 B1 | 2/2003 | Newns et al. | | |
| 6,982,453 B2 * | 1/2006 | Kanaya et al. | ........... | 365/145 |
| 7,057,221 B2 * | 6/2006 | Takashima | ........... | 365/145 |
| 7,391,706 B2 | 6/2008 | Nauka et al. | | |
| 2002/0013006 A1 | 1/2002 | Miki et al. | | |
| 2005/0078504 A1 | 4/2005 | Lin et al. | | |
| 2005/0213364 A1 | 9/2005 | Kijima et al. | | |
| 2006/0023606 A1 | 2/2006 | Lutwyche et al. | | |
| 2007/0047290 A1 | 3/2007 | Hong et al. | | |
| 2008/0151609 A1 | 6/2008 | Hamberg et al. | | |
| 2008/0170488 A1 | 7/2008 | Zuffada et al. | | |

OTHER PUBLICATIONS

Y. Hotta, T. Susaki, and HY Hwang (2007). "Polar Discontinuity Doping of the LaVO3/SrTi03 Interface", Dept. of Advanced Materials Science, University of Tokyo, Japan. (18 pages).
N. Nakagawa, H. Hwang, D. Muller. "Why Some Interfaces Cannot be Sharp" Nature Materials, Nature Publishing Group, vol. 5, Jan. 22, 2006. (6 pages).
A. Ohtomo & H. Y. Hwang, "A high-mobility electron gas at the $LaAlO_3$ heterointerface", *letters to nature*, Nature Publishing Group, vol. 427, Jan. 29, 2004. (4 pages).
N. Nakagawa, H. Hwang, D. Muller, "Why Some Interfaces Cannot be Sharp", 204-209 Dept. of Advanced Materials Science, University of Tokyo, Japan. (20 pages).
S. Thiel et al., "Tunable Quasi-Two-Dimensional Electron Gases in Oxide Heterostructures", Science, vol. 313, Sep. 29, 2006. (5 pages).

* cited by examiner

*Primary Examiner* — Trong Phan
(74) *Attorney, Agent, or Firm* — Brian R. Morrison; Westman, Champlin & Kelly, P.A.

(57) ABSTRACT

A data storage device comprising a ferroelectric layer, a perovskite structure, and at least one sensor, where the perovskite structure has a polarity discontinuity configured to generate capacitance voltages in the perovskite structure based on polarization charges of the ferroelectric material, and where the at least one sensor is configured to read the capacitance voltages from the perovskite structure.

20 Claims, 5 Drawing Sheets

NON-DESTRUCTIVE READ BACK FOR FERROELECTRIC DATA STORAGE DEVICE

BACKGROUND

The present disclosure relates to data storage devices. In particular, the present disclosure relates to ferroelectric data storage devices.

Ferroelectric materials have provided additional means for storing digital data, where the binary "1" and "0" levels are represented by the electric polarization of a ferroelectric film pointing "upward" or "downward". Storage devices based on ferroelectric storage media include Ferroelectric Random Access Memory (FeRAM) and scanning-probe storage systems (FE-Probe). In an FeRAM memory cell, the storage element includes a thin ferroelectric film sandwiched between fixed, conductive electrodes. In comparison, in an Fe-Probe device, one of the electrodes (referred to as a "tip") is movable relative to the media. In each of these media, the ferroelectric material has a spontaneous polarization, which can be reversed by an applied electrical field. FIG. 1 is plot of polarization ("P") versus the applied voltage ("V"), which illustrates a hysteresis loop typically attained with a ferroelectric material. As shown, when no biasing voltage is applied (i.e, V=0), the ferroelectric material has two stable points along the plot (referred to as points "a" and "b"), which exhibit opposing polarizations. Due to their high stability, the points "a" and "b" are suitable for data storage, where the points "a" and "b" may correspond to the binary "1" and "0" levels, respectively.

The hysteresis loop also identifies the coercive voltage ($V_c$) required to cause a change in the stored polarization charge. When writing data to a ferroelectric medium, the applied voltage, either positive or negative, must have an amplitude greater than the coercive voltage $V_c$ of the ferroelectric material. For example, if the polarization charge of a given ferroelectric media is located at point "a", an application of a negative voltage greater than $-V_c$ causes the polarization of the ferroelectric material to spontaneously reverse by passing from point "a", through point "c", and to point "b". If a subsequent positive voltage greater than $+V_c$ is then applied, the polarization of the ferroelectric material will spontaneously reverse again by passing from point "b", through point "d", and back to point "a". By applications of the voltages in this manner, the polarization of the ferroelectric material may reverse to stable positions, thereby allowing the binary "1" and "0" levels to be selectively written to the ferroelectric medium.

While such ferroelectric media are suitable for storing data, the data-reading techniques used with such media are based on a destructive operation, in which the read data is lost during the read operation. A read operation in a ferroelectric medium is performed by measuring the current flowing in the ferroelectric material, which is based on the polarization charge of the given material. However, current read measurements require a voltage to be applied that is greater than the coercive voltage ($V_c$) of the ferroelectric material. Thus, upon reading the current, the data stored in the ferroelectric material is effectively lost. As a result, current ferroelectric data storage media must be rewritten after a read operation to restore the previously written data. This typically involves storing the read data in a memory buffer, and rewriting the data back into the ferroelectric media after the read operation. This increases time and power consumption for reading and writing data onto ferroelectric data storage media.

SUMMARY

An aspect of the disclosure is directed to a data storage device that includes a ferroelectric layer, and a perovskite structure disposed adjacent to the ferroelectric layer. The perovskite structure has a polarity discontinuity configured to generate capacitance voltages in the perovskite structure based on polarization charges of the ferroelectric material. The data storage device also includes at least one sensor configured to read the capacitance voltages from the perovskite structure.

Another aspect of the disclosure is directed to a data storage device that includes a ferroelectric layer and a multi-layer structure. The multi-layer structure includes a first, second, and third layer, where the first layer comprises a first complex oxide material exhibiting a first family charge, the second layer comprises a second complex oxide material exhibiting a second family charge that is different from the first family charge, and the third layer comprises a third complex oxide material exhibiting a third family charge that is different from the second family charge. The data storage device also includes at least one sensor in signal communication with at least the first layer and the third layer of the multi-layer structure.

A further aspect of the disclosure is directed to a method of operating a data storage device. The method includes generating electrons and electrons holes in a perovskite structure disposed adjacent to a ferroelectric layer based on polarization charges of the ferroelectric layer, creating capacitance charges in the perovskite structure from the generated electrons and electrons holes, and detecting the capacitance charges in the perovskite structure as read back signals.

DETAILED DESCRIPTION

Figure 2:
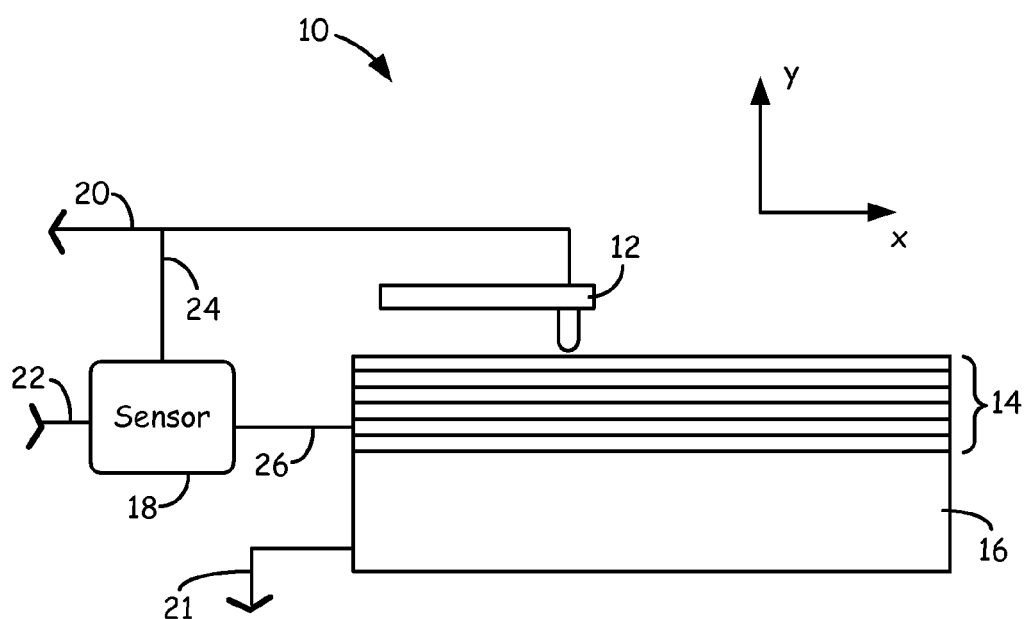
FIG. 2 is a schematic illustration of a ferroelectric data storage device of the present disclosure.

As shown in FIG. 2, device 10 is a ferroelectric data storage device that includes writer assembly 12, storage medium 14, conductive layer 16, and capacitance sensor 18. Writer assembly 12 is a component for writing data onto storage medium 14 by applying a voltage to storage medium 14. Writer assembly 12 may include a variety of different conductive electrodes and arrays of electrodes, and is desirably in signal communication with a processing system of a host computer (not shown) via communication line 20. For example, writer assembly 12 may be a stationary device relative to storage medium 14, and the distance between probe 12 and storage medium 14 may be fixed (e.g., for an FeRAM memory cell). In alternative embodiments, one or both of writer assembly 12 and storage medium 14 may move relative to each other in substantially parallel planes (e.g., for an Fe-probe device). In these embodiments, writer assembly 12 may be scanned across storage medium 14 during data writing operations, thereby allowing a single electrode of writer assembly 12 to interact with multiple data regions on storage medium 14.

As discussed below, storage medium 14 desirably includes at least one layer of a ferroelectric material and a multi-layer, perovskite structure, where the perovskite structure includes polarity discontinuities configured to generate electrons and electron holes based on the polarization charges of the ferroelectric layer. These generated electrons and electron holes accordingly allow the perovskite structure to function as a capacitor. Conductive layer 16 is a conductive base layer of device 10, and may include a variety of different electrically-conductive materials. Examples of suitable electrically-conductive materials for conductive layer 16 include compounds of strontium (Sr), ruthenium (Ru), and oxygen (O) (e.g., $SrRuO_3$). In the shown embodiment, conductive layer 16 may be grounded via ground line 21.

Capacitance sensor 18 may include one or more sensors for detecting capacitance charges in or across the perovskite structure of storage medium 14. Capacitance sensor 18 is desirably in signal communication with the processing system of the host computer via communication line 22, and may also be in signal communication with writer assembly 12 via communication line 24, and with the perovskite structure of storage medium 14 via communication line 26. This allows capacitance sensor 18 to detect any capacitance charges stored in the perovskite structure as read back signals.

Figure 1:
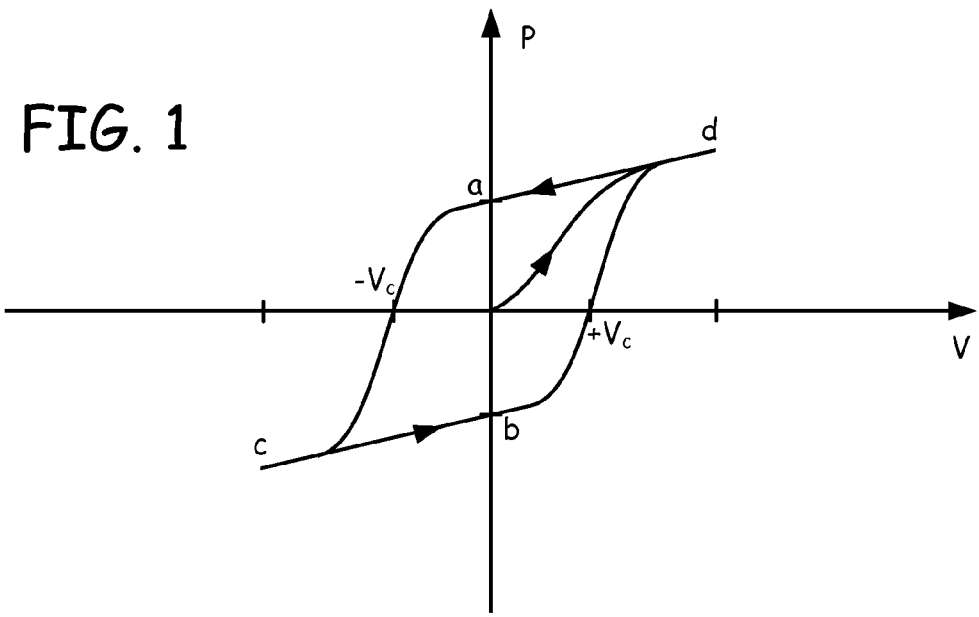
FIG. 1 is a graphical illustration of a hysteresis loop of a ferroelectric material.

During a write operation, writer assembly 12 applies biasing voltages to multiple data regions in the ferroelectric layer of storage medium 14. These applied voltages are greater than the coercive voltage of the ferroelectric material. This allows the ferroelectric material at each data region to flip to an "upward" or "downward" polarization charge corresponding to the stable points "a" and "b" in the hysteresis loop shown in FIG. 1. The stable polarization points allow the stored data to be identified as either a binary "1" or "0" value for each data region in the ferroelectric material. Based on the "upward" or "downward" polarity of the ferroelectric material, the perovskite structure may generate electrons and electron holes due to the polarity discontinuity in the perovskite structure, as discussed below. The generated electrons and electron holes correspondingly create capacitance charges within the perovskite structure, where the capacitance charges desirably do not affect the stable polarization charges of the ferroelectric material.

During a subsequent read operation, for each data region, capacitance sensor 18 may read the capacitance charge retained in the perovskite structure as a read back signal corresponding to the polarization charge of the ferroelectric material. As such, capacitance sensor 18 functions as a reader for identifying the polarization charge of the ferroelectric material. Furthermore, the read back of the capacitance charges from the perovskite structure does not require an application of a read back biasing voltage that is greater than the coercive voltage of the ferroelectric material. This allows the data to be effectively read from the ferroelectric material in a non-destructive manner, which precludes the need to rewrite the read data from a memory buffer. This reduces time and power consumption requirements for reading data from device 10, and further reduces the risk of data loss due to miswrites.

Figure 3:
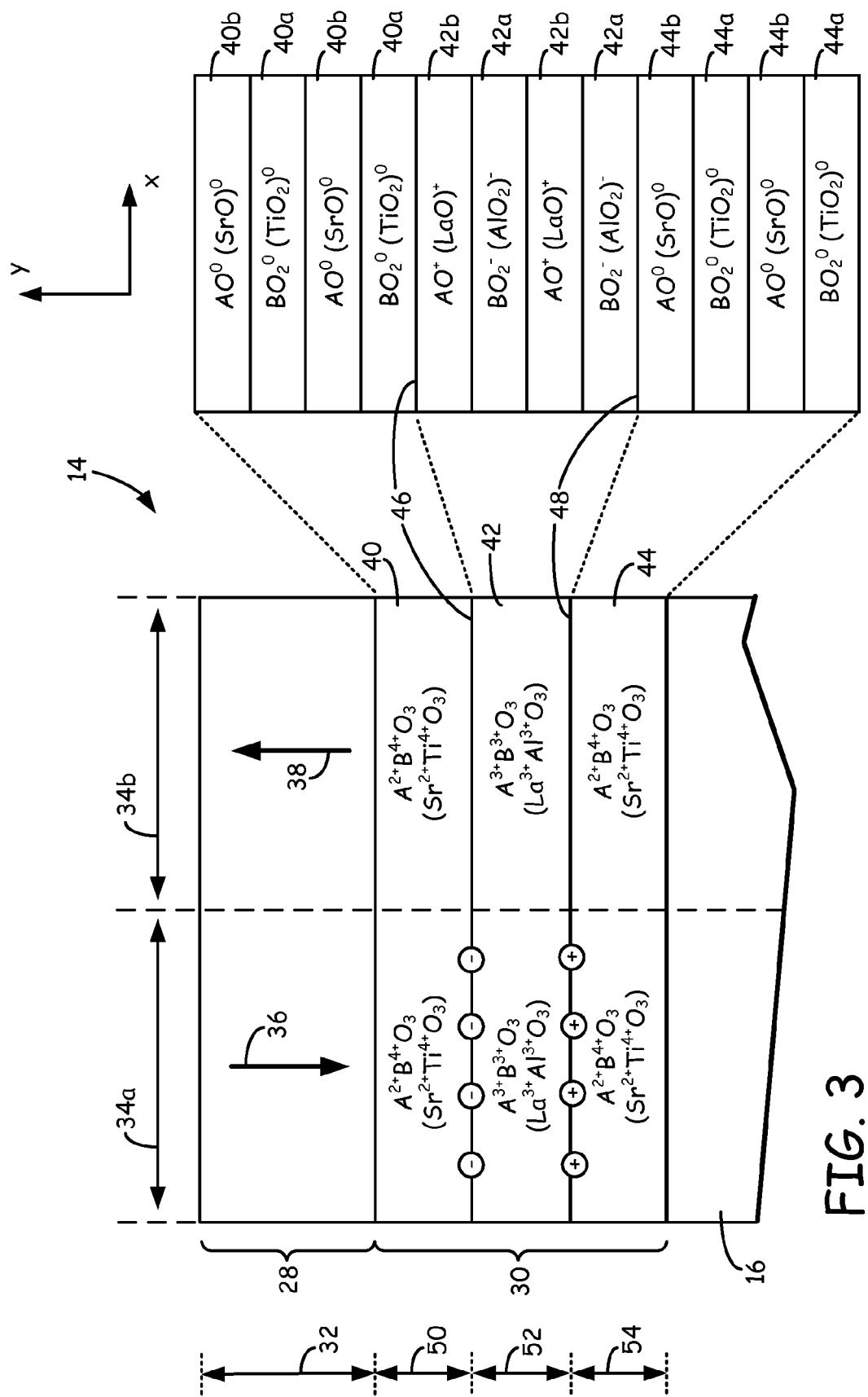
FIG. 3 is a schematic illustration of a storage medium of the ferroelectric data storage device.

FIG. 3 is a schematic illustration of storage medium 14 on conductive layer 16, illustrating ferroelectric layer 28 and perovskite structure 30. Ferroelectric layer 28 may include one or more ferroelectric materials capable of changing polarization directions based on an applied electric voltage that is greater in amplitude than the coercive voltage of the material. Examples of suitable ferroelectric materials for ferroelectric layer 28 include lead-zirconate-titanates ($Pb[Zr_x, Ti_{1-x}]O_3$) (e.g., $PbZr_{0.2}Ti_{0.8}O_3$), bismuth ferrite ($BiFeO_3$), Barium titanate ($BaTiO_3$), strained strontium titanate ($SrTiO_3$), strontium bismuth tantalate ($SrBi_2Ta_2O_9$), and combinations thereof. The ferroelectric materials may also be doped with one or more additives (e.g., lanthanum). Suitable coercive voltages for these ferroelectric materials range from about 1.0 volt to about 5.0 volts. Suitable average layer thicknesses for ferroleletric layer 28 (referred to as layer thickness 32) range from about 5 nanometers to about 50 nanometers, with particularly suitable average layer thicknesses ranging from about 10 nanometers to about 30 nanometers.

Ferroelectric layer 28 is divided into data regions 34a and 34b, which are exemplary data regions of the entire array of data regions in ferroelectric layer 28. As further shown, the ferroelectric material in data region 34a exhibits a downward directed polarization charge (represented by arrow 36), and the ferroelectric material in data region 34b exhibits an upward directed polarization charge (represented by arrow 38). These opposing polarities may represent the binary "1" and "0" values, respectively (or a reciprocal representation may be used). The upward and downward polarities of the ferroelectric layer 28 in data regions 34a and 34b may be attained by writer assembly 12 (shown in FIG. 1), which applies a biasing voltage to ferroelectric layer 28 at each of data regions 34a and 34b.

Perovskite structure 30 includes layers 40, 42, and 44, each of which are complex oxide layers having the general formula $ABO_3$, where "A" and "B" represent elements of various cations, and "O" refers to an exemplary anion (i.e., oxygen). As shown, layer 42 is disposed between layers 40 and 44, and is derived from a complex oxide of a charge family that is different from the complex oxides of layers 40 and 42. This creates heterointerface 46 between layers 40 and 42, and heterointerface 48 between layers 42 and 44, where the polarity discontinuities of perovskite structure 30 arise at heterointerfaces 46 and 48.

The complex oxides of layers 40, 42, and 44 may each include materials having the charge family formulas of $A^{3+}B^{3+}O_3$, $A^{2+}B^{4+}O_3$, and $A^{1+}B^{5+}O_3$, where the resulting $ABO_3$ is neutral, and where adjoining layers are derived from complex oxides of different charge families. Suitable complex oxides for layers 40, 42, and 44 include any perovskite-type material, such as strontium titanate ($SrTiO_3$), lanthanum aluminate ($LaAlO_3$), lead vanadate ($PbVO_3$), lanthanum manganite ($LaMnO_3$), lanthanum calcium manganite ($LaCaMnO_3$), and lanthanum strontium manganite ($LaSrMnO_3$).

In the example shown in FIG. 3, layers 40 and 44 are each composed of neutral layers derived from an $A^{2+}B^{4+}O_3$ material, such as strontium titanate ($Sr^{2+}Ti^{4+}O_3$), and layer 42 is a polar $A^{3+}B^{3+}O_3$ material, such as lanthanum aluminate ($La^{3+}Al^{3+}O_3$). Thus, the charge families of the materials for layers 40 and 44 (i.e., $A^{2+}B^{4+}O_3$ materials) are different from the charge family of the material for layer 42 (i.e., an $A^{3+}B^{3+}O_3$ material).

As shown in the expanded portion of FIG. 3, layers 40, 42, and 44 may each be formed by depositing alternating films of AO and $BO_2$ materials, where the films of the AO (e.g., $AO^-$, $AO^0$, and $AO^+$) and $BO_2$ (e.g., $BO_2^-$, $BO_2^0$, and $BO_2^+$) materials may at least partially interdiffuse. For example, for strontium titanate ($SrTiO_3$), layer 40 may be formed by depositing alternating films 40a of titanium dioxide $(TiO_2)^0$ and films 40b of strontium oxide $(SrO)^0$. Correspondingly, for lanthanum aluminate ($LaAlO_3$), layer 42 may be formed by depositing alternating films 42a of aluminum oxide $(AlO_2)^-$ and films 42b of lanthanum oxide $(LaO)^+$. Similarly, for strontium titanate ($SrTiO_3$), layer 44 may be formed by depositing alternating film 44a of titanium dioxide $(TiO_2)^0$ and films 44b of strontium oxide $(SrO)^0$. As discussed above, the deposited films may at least partially interdiffuse, thereby providing mixtures of the given films.

A variety of different deposition techniques may used to form layers 40, 42, and 44 in an epitaxial manner on conductive layer 16. Suitable deposition techniques include physical vapor deposition techniques (e.g., cathodic arc and pulsed laser deposition techniques) desirably with the use of single-crystal and/or polycrystalline targets of the various films. The depositions may be performed at elevated temperatures (e.g., from about 300° C. to about 800° C.), and are desirably performed under partial pressure or vacuum conditions (e.g., $1 \times 10^{-6}$ Torr or less). Heterointerface 48 is desirably attained by forming one or both of layer 44 (e.g., $SrTiO_3$) and layer 42 (e.g., $LaAlO_3$) with (001)-oriented structures. Similarly, heterointerface 46 is desirably attained by forming one or both of layer 42 ($LaAlO_3$) and layer 40 (e.g., $SrTiO_3$) with (001)-oriented structures. The (001)-orientations may be grown with the use of single-crystal targets of the grown films (e.g., SrO film 44b and LaO film 42b). In alternative embodiments, one or more of layers 40, 42, and 44 may be deposited as discussed above as bulk layers of the given materials (i.e., rather than as multi sub-layers). In these embodiments, layers 40, 42, and 44 may be grown from targets comprising the materials of the given layers.

Suitable numbers of alternating films for each of layers 40, 42, and 44 may vary depending on the desired layer thicknesses of layers 40, 42, and 44 (referred to as layer thicknesses 50, 52, and 54). Examples of suitable numbers of alternating films include at least two films per layer (i.e., a single AO film and a single $BO_2$ film), with particularly suitable numbers of alternating films including at least four films per layer (i.e., two AO films and two $BO_2$ films). FIG. 3 illustrates an embodiment in which each of layers 40, 42, and 44 include two films per layer (i.e., films 40a/40b for layer 40, films 42a/42b for layer 42, and films 44a/44b for layer 44). Correspondingly, examples of suitable average layer thicknesses for layers 40 and 44 (i.e., layer thicknesses 50 and 54) each range from about 0.4 nanometers to about 10.0 nanometers, with particularly suitable average layer thicknesses ranging from about 1.0 nanometer to about 5.0 nanometers. Layer thickness 52 of layer 42 is desirably less than a critical thickness to allow heterointerfaces 46 and 48 to be conductive. Examples of suitable average layer thicknesses for layer 42 (i.e., layer thickness 52) include thicknesses of about 10.0 nanometers or less, with particularly suitable average layer thicknesses ranging from about 1.0 nanometer to about 5.0 nanometers. As discussed above, the complex oxides of layers 40, 42, and 44 may at least partially interdiffuse, which may effectively eliminate actual layer boundaries.

Due to the different charge families of the materials for layers 40 and 42, and for layers 42 and 44, heterointerfaces 46 and 48 may each include partially interdiffused materials of layers 40, 42, and 44. For example, for layers 40 and 44 being derived from strontium titanate ($SrTiO_3$) and layer 42 being derived from lanthanum aluminate ($LaAlO_3$), heterointerface 46 may be an interface between the titanium dioxide ($TiO_2$) film 40a of layer 40 and the lanthanum oxide (LaO) film 42b of layer 42. This interface may include an interdiffused mixture of aluminum oxide ($AlO_2$) from layer 42, lanthanum oxide (LaO) from layer 42, and titanium dioxide ($TiO_2$) from layer 40. Correspondingly, heterointerface 48 may be an interface between the aluminum oxide ($AlO_2$) film 42a of layer 42 and the strontium oxide (SrO) film 44b of layer 44. This interface may include an interdiffused mixture of aluminum oxide ($AlO_2$) from layer 38, lanthanum oxide (LaO) from layer 42, and titanium dioxide ($TiO_2$) from layer 44.

As discussed above, data region 34a exhibits a downward polarization charge. This downward-directed polarization charge applies an electric field to perovskite structure 30 at data region 34a that generate electrons and electron holes respectively at heterointerfaces 46 and 48. In particular, the applied electric field excites the complex oxides, thereby allowing electrons from the complex oxides to redistribute to heterointerface 46, as illustrated in FIG. 3. This correspondingly causes electron holes to form at heterointerface 48, where the electrons at heterointerface 46 and the electron holes at heterointerface 48 are separated by layer 42. This arrangement allows perovskite structure 30 to operate as a capacitor, where layer 42 functions as an insulating layer.

In contrast to data region 34a, data region 34b exhibits an upward polarization charge, in which the applied electric field does not generate electrons and electron holes in perovskite structure 30. Thus, within data region 34b, electrons and electron holes are not generated at heterointerfaces 46 and 48. Because perovskite structure 30 remains neutral within data region 34b, a capacitance charge is not created across layer 42 in data region 34b.

During a read operation, communication line 24 (shown in FIG. 1) interconnects capacitance sensor 18 (shown in FIG. 1) respectively with layer 42. This allows capacitance sensor 18 to detect whether each data region exhibits a capacitance charge based on the location of writer assembly 12. Accordingly, when capacitance sensor 18 reads data region 34a, the capacitance charge across layer 42 at data region 34a is detected. This allows the host computer to identify that the ferroelectric material at data region 34a exhibits a downward polarization charge corresponding to either a binary "1" or "0" value. Because the capacitance read back across voltage layer 42 is substantially less than the coercive voltage of the ferroelectric material, data region 34a may be read by capacitance sensor 18 in a non-destructive manner (i.e., the polarization charge of the ferroelectric material at data region 34a in not affected by the application of the capacitance read back voltage).

When capacitance sensor 18 reads data region 34b, capacitance sensor 18 does not detect a capacitance charge across layer 42. This allows the host computer to identify that the ferroelectric material at data region 34b exhibits an upward polarization charge corresponding to the opposing binary "1" or "0" value from the downward polarization charge. Accordingly, capacitance sensor 18 may read data from each data region of storage medium 14 without affecting the polarization charges of the ferroelectric material in the given data regions. This precludes the need to rewrite the read data from storage buffers, thereby reducing time and power consumptions for operating device 10.

Figure 4:
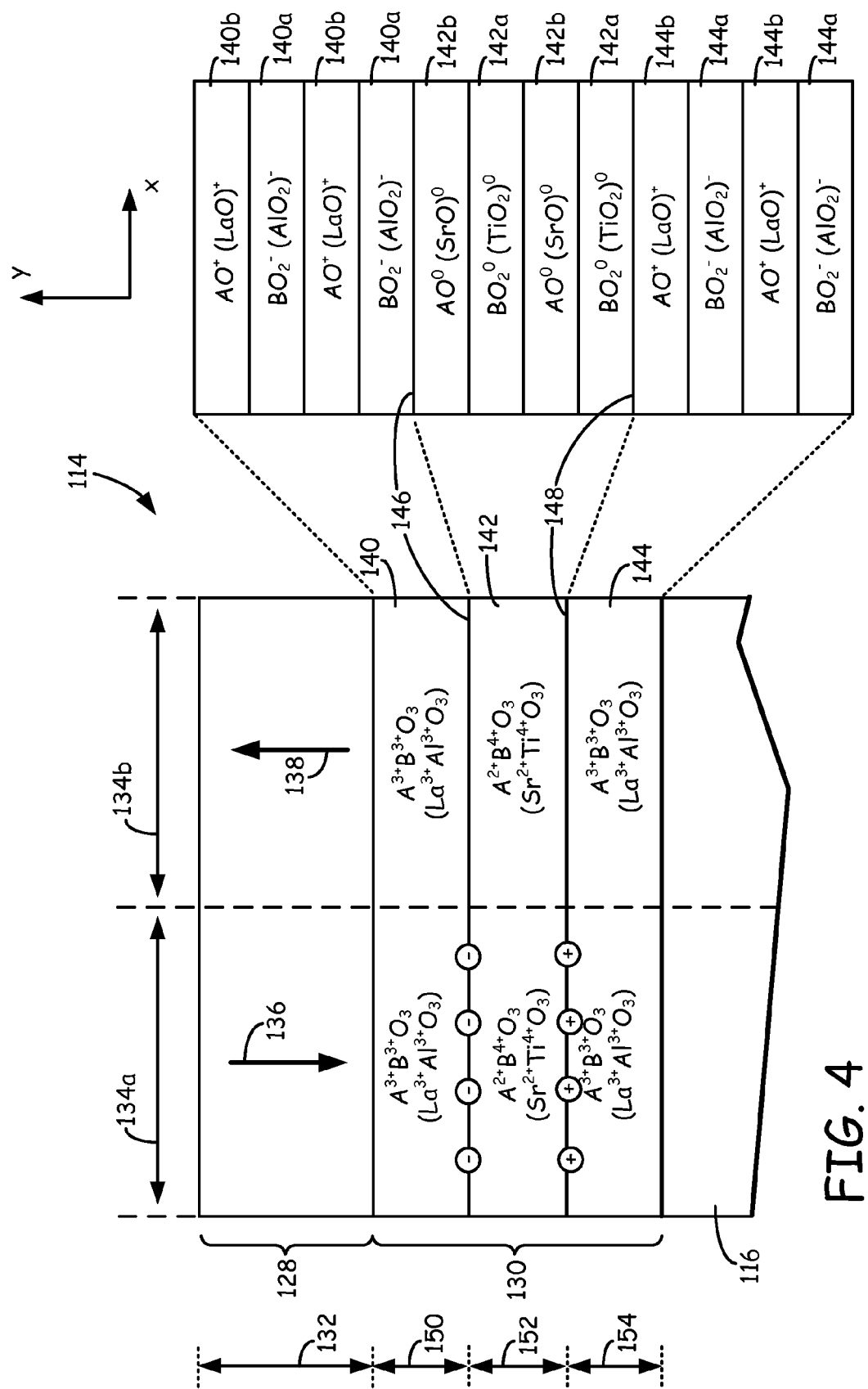
FIG. 4 is a schematic illustration of a first alternative storage medium of the ferroelectric data storage device.
Figure 5:
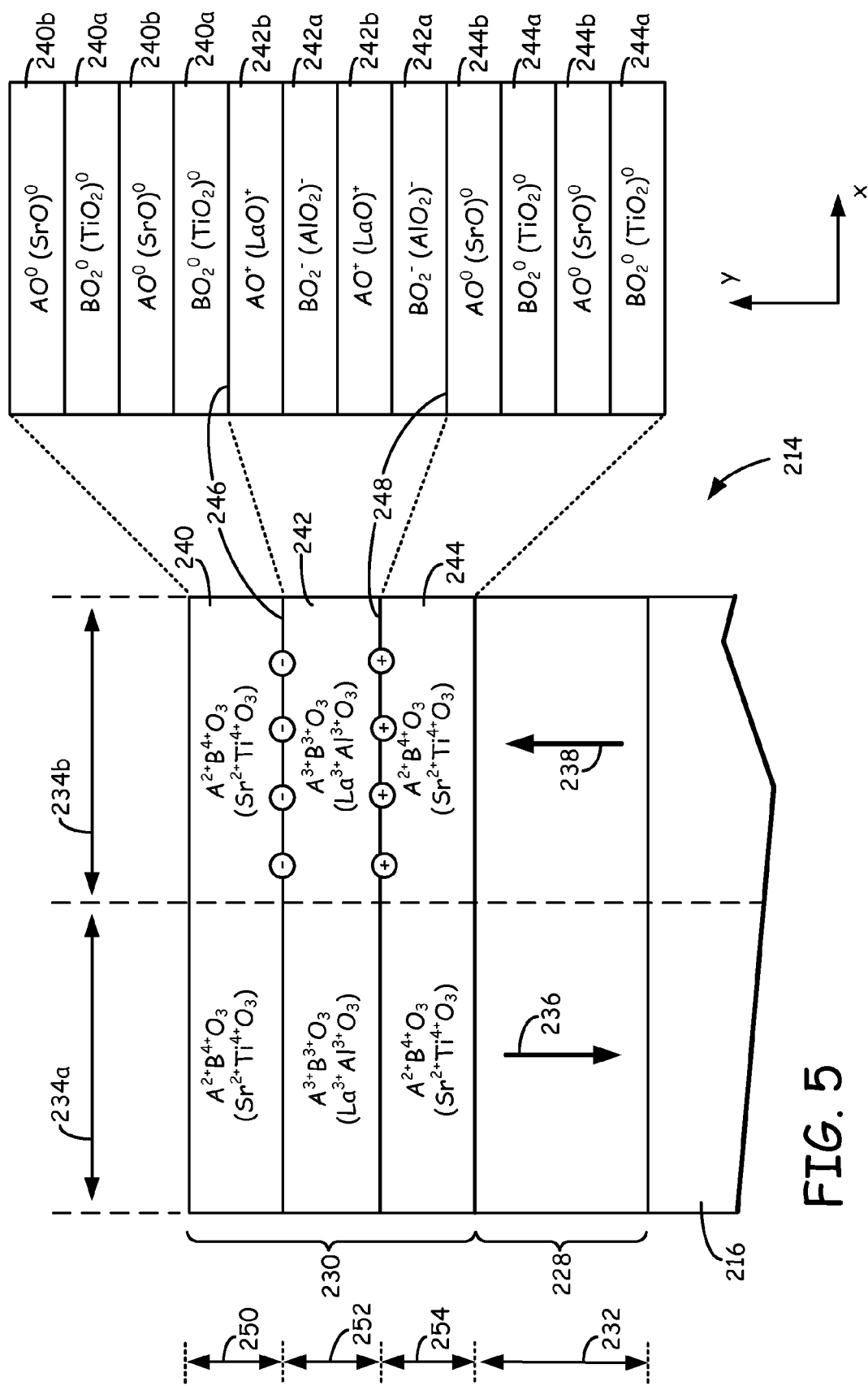
FIG. 5 is a schematic illustration of a second alternative storage medium of the ferroelectric data storage device.
Figure 6:
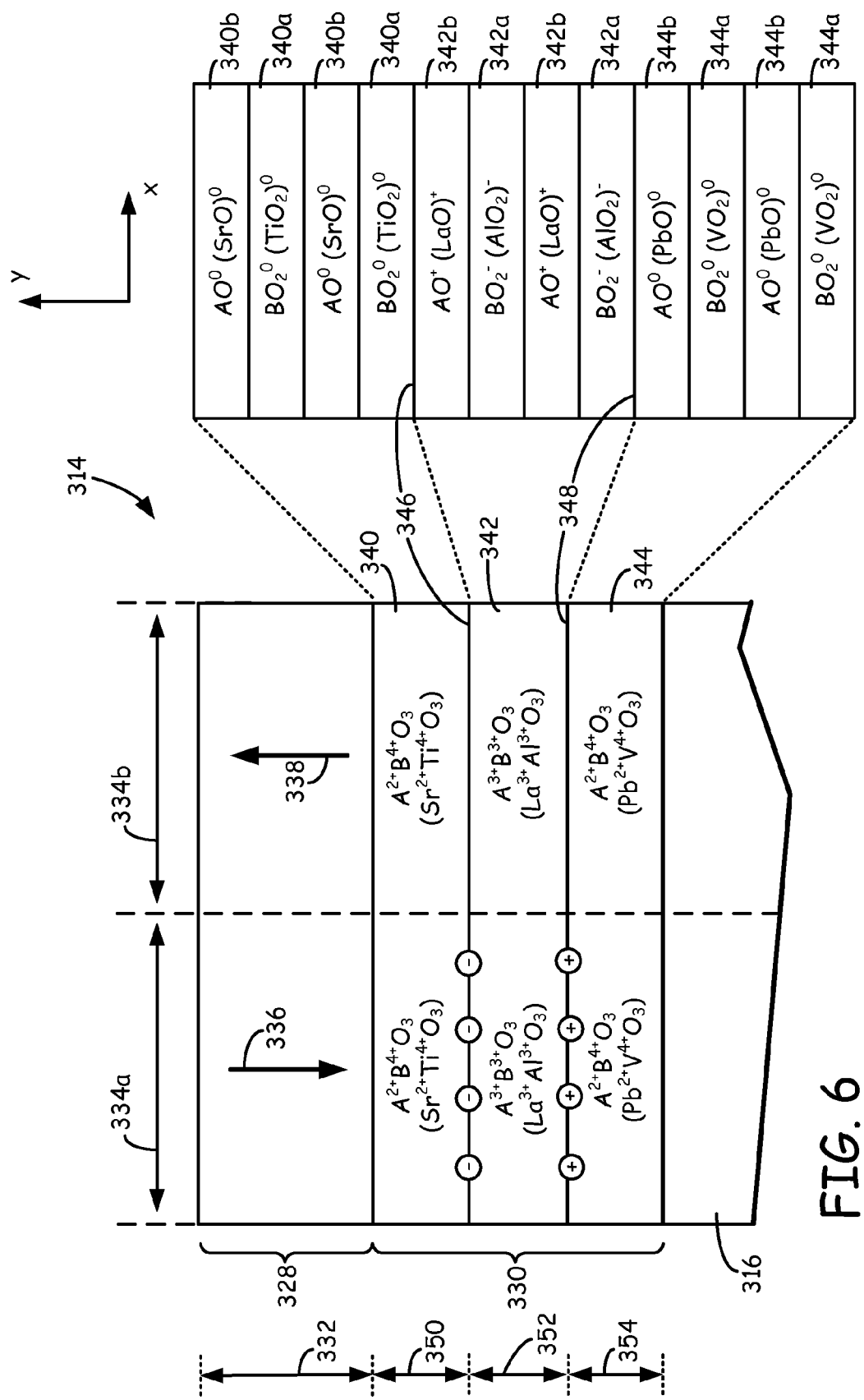
FIG. 6 is a schematic illustration of a third alternative storage medium of the ferroelectric data storage device.

FIGS. 4-6 illustrate alternative embodiments to storage medium 14 (shown in FIG. 3), where the reference labels are increased by "100", "200", and "300" respectively. The embodiments discussed below illustrate a wide variety of perovskite structures that may be used with device 10. As shown in FIG. 4, perovskite structure 130 has a reciprocal layer arrangement from storage medium 14, where an $A^{2+}B^{4+}O_3$ (e.g., $Sr^{2+}Ti^{4+}O_3$, from films 142a of $(TiO_2)^0$ and films 142b of $(SrO)^0$) neutral layer 142 is disposed between a pair of $A^{3+}B^{3+}O_3$ (e.g., $La^{3+}Al^{3+}O_3$, from films 140a and 144a of $(AlO_2)^-$, and films 140b and 144b of $(LaO)^+$) layers 140 and 144. This embodiment also provides different family charges between the adjacent layers, and is also suitable for generating electrons and electron holes in the same manner as discussed above for perovskite structure 30 (shown in FIG. 3).

As shown in FIG. 5, ferroelectric layer 228 is disposed between substrate 216 and perovskite structure 230. In this embodiment, the writer assembly (e.g., writer assembly 12, shown in FIG. 1) may apply the biasing voltage through perovskite structure 230 during a write operation. Perovskite structure 230 functions in a similar manner as perovskite structure 30 (shown in FIG. 3), and includes layer 240 (e.g., $Sr^{2+}Ti^{4+}O_3$, from films 240a of $(TiO_2)^0$ and films 240b of $(SrO)^0$), layer 242 (e.g., $La^{3+}Al^{3+}O_3$, from films 242a of $(AlO_2)^-$ and films of 242b of $(LaO)^+$), and layer 244 (e.g., $Sr^{2+}Ti^{4+}O_3$, from films 244a of $(TiO_2)^0$ and films 244b of $(SrO)^0$). However, due to the location of ferroelectric layer 228 relative to perovskite structure 230, the electric field created by the upward-directed polarization charge generates the electrons and electron holes in perovskite structure 230. This is in contrast to storage medium 14 shown in FIG. 3, in which the electric field from the downward-directed polarization charge generates the electrons and electrons holes in perovskite structure 30. As such, perovskite structure 230 in data region 34b includes the generated electrons and electron holes from the applied electric field, which creates a capacitance charge across layer 242 in data region 34b. In contrast, perovskite structure 230 in data region 34a remains neutral. This embodiment illustrates an example of different interlayer arrangements that may be used for the storage medium of device 10.

As shown in FIG. 6, layers 340 and 344 of perovskite structure 330 include different complex oxide materials. In the example shown, layer 340 includes a complex oxide material (e.g., $Sr^{2+}Ti^{4+}O_3$, from films 340a of $(SrO)^0$ and films 340b of $(TiO_2)^0$) and layer 344 films 344b of $(PbO)^0$), around layer 340 (e.g., $La^{3+}Al^{3+}O_3$, from films 342a of $(AlO_2)^-$ and films 342b of $(LaO)^+$). This arrangement also allows layers 340, 342, and 344 to have different family charges between adjacent layers, while also allowing layers 340 and 344 to be derived from different complex oxides. In additional alternative embodiments, one or more of layers 340, 342, and 344 may be derived of complex oxide materials having the formula $A^{1+}B^{5+}O_3$. In these embodiment, layers 340, 342, and 344 may each be derived of complex oxide materials having different family charges.

Although the present disclosure has been described with reference to preferred embodiments, workers skilled in the art will recognize that changes may be made in form and detail without departing from the spirit and scope of the disclosure.

The invention claimed is:

1. A data storage device comprising:
  a ferroelectric layer comprising a ferroelectric material;
  a perovskite structure disposed adjacent to the ferroelectric layer, and having a polarity discontinuity configured to generate capacitance voltages in the perovskite structure based on polarization charges of the ferroelectric material; and
  at least one sensor configured to read the capacitance voltages from the perovskite structure.

2. The data storage device of claim 1, wherein read back voltages applied by the at least one sensor have amplitudes that are less than a coercive voltage amplitude of the ferroelectric material.

3. The data storage device of claim 1, wherein the ferroelectric material is selected from the group consisting of lead-zirconate-titanates, bismuth ferrites, Barium titanates, strained strontium titanates, strontium bismuth tantalates, and combinations thereof.

4. The data storage device of claim 1, wherein the perovskite structure comprises a plurality of layers, and wherein each of the plurality of layers is selected from the group consisting of strontium titanate, lanthanum aluminate, lead vanadate, lanthanum manganite, lanthanum calcium manganite, and lanthanum strontium manganite.

5. The data storage device of claim 1, wherein the perovskite structure comprises:
  a first complex oxide layer disposed adjacent to the ferroelectric layer;
  a second complex oxide layer disposed adjacent to the first complex oxide layer on an opposing side of the first complex oxide layer from the ferroelectric layer; and
  a third complex oxide layer disposed adjacent to the second complex oxide layer on an opposing side of the second complex oxide layer from the first complex oxide layer.

6. The data storage device of claim 5, wherein the second complex oxide layer has a layer thickness of about 10 nanometers or less.

7. The data storage device of claim 1, and further comprising an electrically-conductive layer.

8. The data storage device of claim 7, wherein the perovskite structure is disposed between the ferroelectric layer and the electrically-conductive layer.

9. A data storage device comprising:
  a ferroelectric layer comprising a ferroelectric material;
  a multi-layer structure comprising:
    a first layer disposed adjacent to the ferroelectric layer, and comprising a first complex oxide material exhibiting a first family charge;
    a second layer disposed adjacent to the first layer an opposing side of the first layer from the ferroelectric layer, and comprising a second complex oxide material exhibiting a second family charge that is different from the first family charge; and
    a third layer disposed adjacent to the second layer on an opposing side of the second layer from the first layer, and comprising a third complex oxide material exhibiting a third family charge that is different from the second family charge; and
  at least one sensor in signal communication with at least the second layer of the multi-layer structure.

10. The data storage device of claim 9, wherein the multi-layer structure is configured to create capacitance voltages across the second layer based on polarization charges of the ferroelectric layer.

11. The data storage device of claim 10, wherein read back voltages applied by the at least one sensor have amplitudes that are less than a coercive voltage amplitude of the ferroelectric material.

12. The data storage device of claim 9, wherein the ferroelectric material is selected from the group consisting of lead-zirconate-titanates, bismuth ferrites, Barium titanates, strained strontium titanates, strontium bismuth tantalates, and combinations thereof.

13. The data storage device of claim 9, wherein the first complex oxide material, the second complex oxide material, and the third complex oxide material are each selected from the group consisting of strontium titanate, lanthanum aluminate, lead vanadate, lanthanum manganite, lanthanum calcium manganite, and lanthanum strontium manganite.

14. The data storage device of claim 9, wherein the first complex oxide material and the third complex oxide material are different from the second complex oxide material.

15. The data storage device of claim 9, wherein the second layer has a layer thickness of about 10 nanometers or less.

16. A method of operating a data storage device, the method comprising:
  generating electrons and electron holes in a perovskite structure disposed adjacent to a ferroelectric layer based on polarization charges of the ferroelectric layer; and creating capacitance charges in the perovskite structure from the generated electrons and electron holes; and detecting the capacitance charges in the perovskite structure as read back signals.

17. The method of claim 16, and further comprising applying biasing voltages to the ferroelectric layer to set the polarization charges in the ferroelectric layer, wherein the applied biasing voltages have amplitudes greater than a coercive voltage amplitude of a ferroelectric material of the ferroelectric layer.

18. The method of claim 17, wherein applying the biasing voltages to the ferroelectric layer is performed with an electrode, and wherein detecting the capacitance charges in the perovskite structure is performed with a sensor.

19. The method of claim 16, wherein detecting the capacitance charges comprises applying read back voltages that have amplitudes that are less than a coercive voltage amplitude of a ferroelectric material of the ferroelectric layer.

20. The method of claim 16, wherein generating electrons and electron holes in the perovskite structure comprises redistributing the electrons from complex oxide layers of the perovskite structure to at least one heterointerface in the perovskite structure.

\* \* \* \* \*